United States Patent
Gautam et al.

(10) Patent No.: US 9,746,502 B2
(45) Date of Patent: Aug. 29, 2017

(54) SYSTEMS AND METHODS FOR MONITORING AND CONTROLLING A POWER CONVERTER

(71) Applicant: General Electric Company, Schenectady, NY (US)

(72) Inventors: Ravi Gautam, Plano, TX (US); Palanivel Subramaniam, Richardson, TX (US); Raghothama Reddy, Plano, TX (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 303 days.

(21) Appl. No.: 14/615,069

(22) Filed: Feb. 5, 2015

(65) Prior Publication Data

US 2016/0126855 A1 May 5, 2016

Related U.S. Application Data

(60) Provisional application No. 62/074,336, filed on Nov. 3, 2014.

(51) Int. Cl.
| | |
|---|---|
| *H02M 5/257* | (2006.01) |
| *G01R 19/00* | (2006.01) |
| *H02J 1/10* | (2006.01) |
| *G01R 19/165* | (2006.01) |

(52) U.S. Cl.
CPC ............ *G01R 19/0092* (2013.01); *H02J 1/10* (2013.01); *G01R 19/16538* (2013.01); *G01R 19/16571* (2013.01)

(58) Field of Classification Search
CPC .................................................... H02M 5/257
USPC .. 363/18, 78, 79, 93.1, 93.2, 83, 94, 89, 65; 323/234, 283, 282, 284, 276
See application file for complete search history.

(56) References Cited

U.S. PATENT DOCUMENTS

| | | | |
|---|---|---|---|
| 6,407,899 B1 | 6/2002 | Carpenter | |
| 6,473,280 B1 * | 10/2002 | Buxton | H02M 1/32 307/140 |
| 6,819,060 B2 | 11/2004 | Readio et al. | |

(Continued)

OTHER PUBLICATIONS

Product Catalogue "AVR180: External Brown-out Protection" ATMEL Corporation, 2002, 16 pages.

*Primary Examiner* — Adolf Berhane
*Assistant Examiner* — Nusrat Quddus
(74) *Attorney, Agent, or Firm* — GE Global Patent Operation; Stephen G. Midgley

(57) ABSTRACT

Systems and methods of monitoring a power system power converter are provided herein. The system includes a plurality of parallel-coupled power converters comprising a power converter input and a power converter output, the power converter output configured to be coupled to a load, each power converter of the plurality of parallel-coupled power converters comprising a power converter controller. The power converter controller is configured to compare an output current of a corresponding power converter to a predetermined output current threshold, monitor the output current for a predetermined time duration when the output current is below the predetermined output current threshold, and shut down the corresponding power converter when the output current is below the predetermined output current threshold for the predetermined time duration.

18 Claims, 2 Drawing Sheets

(56) References Cited

U.S. PATENT DOCUMENTS

| | | |
|---|---|---|
| 7,030,668 B1 | 4/2006 | Edwards |
| 7,274,999 B1 | 9/2007 | Saether |
| 7,368,895 B2 | 5/2008 | Shih |
| 7,495,875 B2 | 2/2009 | Lin |
| 7,719,812 B2 | 5/2010 | Phadke et al. |
| 7,863,832 B2 | 1/2011 | Lane et al. |
| 2012/0051098 A1 | 3/2012 | Djenguerian et al. |

* cited by examiner

SYSTEMS AND METHODS FOR MONITORING AND CONTROLLING A POWER CONVERTER

CROSS REFERENCE TO RELATED APPLICATIONS

This application is a non-provisional application and claims priority to U.S. Provisional Patent Application Ser. No. 62/074,336 filed Nov. 3, 2014 for "SYSTEMS AND METHODS OF MONITORING A POWER SYSTEM RECTIFIER", which is hereby incorporated by reference in its entirety.

BACKGROUND

The field of the invention relates generally to power systems, and more particularly, to systems and methods of monitoring a power system power converter.

Telecommunication power plants are designed to maximize reliability. System controllers are used in such power plants to ensure redundancy in installed rectifier capacity for a load at any point in time before performing maintenance tasks. System controllers also equalize the load on each rectifier in a given system. Accuracy of installed capacity at all times is very important to achieve such objectives. At least some known rectifiers are designed to detect and report a variety of failure modes to the system controllers for this purpose. However, it is not possible or economical to detect every failure mode of every part, especially partial failures in various gate drive circuits for switching power devices. For example, a switch in a rectifier may fail and manifest in a non-permanent fault such as under voltage. In reality, this is a permanent failure which prevents reasonable power from being delivered to the load. With no permanent failure detection, the system controller may count this rectifier for installed capacity calculations, which may result in peak charging and a potentially blown fuse and/or decreased system efficiency or reliability.

BRIEF DESCRIPTION

In one aspect, a system is provided that includes a plurality of parallel-coupled power converters comprising a power converter input and a power converter output, the power converter output configured to be coupled to a load, each power converter of the plurality of parallel-coupled power converters comprising a power converter controller. The power converter controller is configured to compare an output current of a corresponding power converter to a predetermined output current threshold, monitor the output current for a predetermined time duration when the output current is below the predetermined output current threshold, and shut down the corresponding power converter when the output current is below the predetermined output current threshold for the predetermined time duration.

In another aspect, a method of monitoring a power system is provided. The power system includes a plurality of parallel-coupled power converters having a power converter input and a power converter output, the power converter output configured to be coupled to a load. Each power converter of the plurality of parallel-coupled power converters includes a power converter controller. The method includes comparing, by the power converter controller for a corresponding power converter, an output current of the corresponding power converter to a predetermined output current threshold, monitoring the output current for a predetermined time duration when the output current is below the predetermined output current threshold, and shutting down the corresponding power converter when the output current is below the predetermined output current threshold for the predetermined time duration.

DETAILED DESCRIPTION

Figure 1:
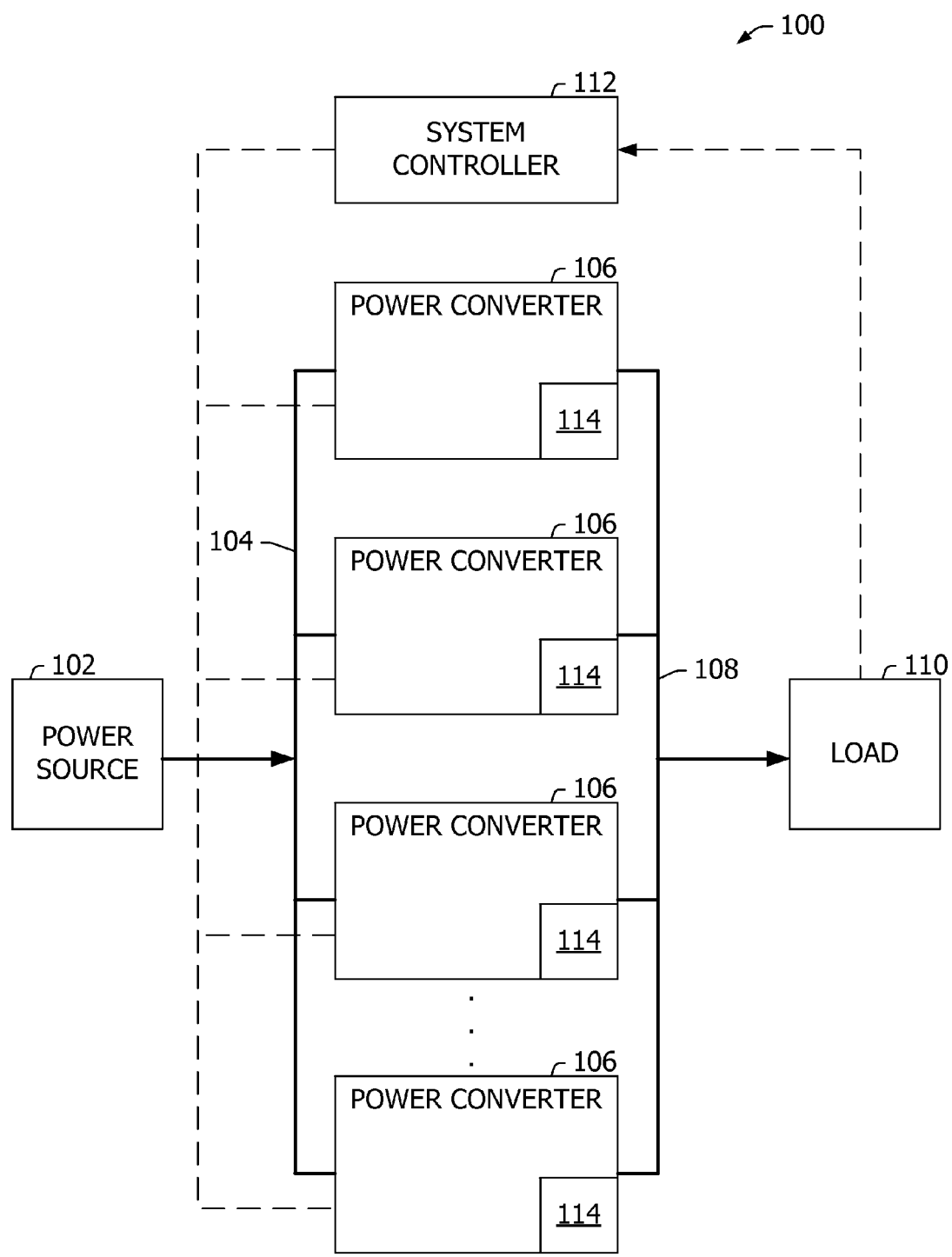
FIG. 1 is a block diagram an exemplary embodiment of a parallel-power converter DC power system.

FIG. 1 is a block diagram an exemplary embodiment of a parallel DC power converter system 100. In the exemplary embodiment, system 100 receives power from a power source 102, for example, the commercial power grid. An AC distribution system 104 distributes the power to a plurality of parallel-coupled power converters 106. Power converters 106 are configured to convert the power to a different type or level. A DC distribution system 108 collects the output of power converters 106 and provides it to a load 110.

In the exemplary embodiment, a system controller 112 is communicatively coupled to power converters 106 and load 110. System controller 112 is configured to monitor a load current demand of load 110. Based on the load current demand, system controller 112 determines an amount of load current to be supported by each power converter 106 such that the load current is equally distributed among each power converter 106. System controller 112 then transmits a load current instruction to each corresponding power converter 106. The load current instruction represents the amount of load current for each power converter 106.

In the exemplary embodiment, power converters 106 are AC-DC rectifiers configured to convert AC power from AC distribution system 104 to DC power. Although described herein as being rectifiers, power converters 106 may be any type of power converter that enables parallel DC power converter system 100 to function as described herein, including, but not limited to, an inverter. Each power converter 106 includes a power converter controller 114 configured to monitor and control operations of power converter 106. For example, power converter controller 114 receives a load current instruction from system controller 112 and operates power converter 106 to output that load current. Power converter controller 114 monitors power converter 106 to make sure that it is outputting the load current. If power converter controller 114 recognizes that power converter 106 is not outputting the required load current or is not meeting a threshold associated with the required load current, and power converter 106 has not realized a fault or failure, power converter controller 114 monitors the output current for a predetermined period of time. If power converter 106 does not meet the required load current for the predetermined period of time, power converter controller 114 shuts down power converter 106.

System controller 112 is configured to communicate with each power converter controller 114 at predetermined time intervals to perform a status check on power converters 106. When failed power converter 106 communicates that it has shut down, system controller 112 decommissions that power converter 106 out of the load share so that it is not depending on that power converter 106 to provide a portion of the load current. System controller 112 then recalculates the load current instruction among the remaining operational power converters 106.

Figure 2:
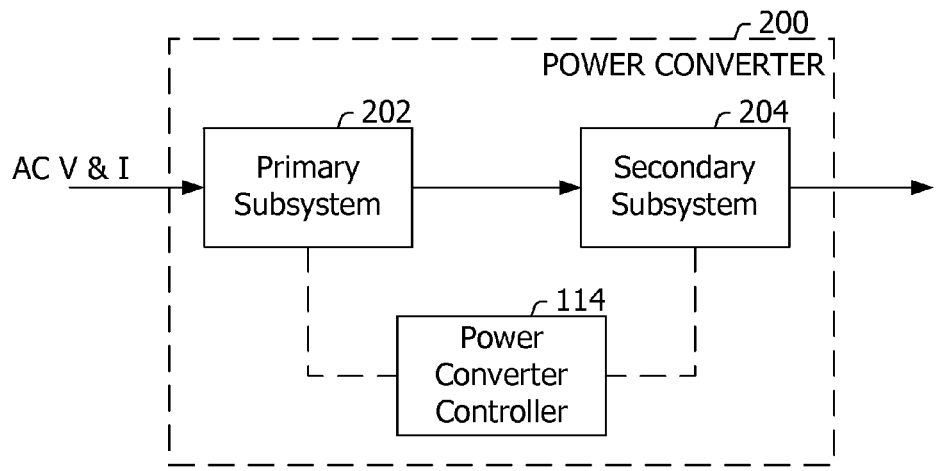
FIG. 2 is a block diagram of an exemplary embodiment of a two-stage power converter used in the DC power system shown in FIG. 1.

FIG. 2 is a block diagram of an exemplary embodiment of a two-stage power converter 200 used in DC power system 100 shown in FIG. 1. In the exemplary embodiment, two-stage power converter 200 includes a primary subsystem 202 and a secondary subsystem 204. Primary subsystem 202 is configured to receive AC input voltage and current, and convert it to a DC voltage. Primary subsystem 202 may be a boost circuit or a PFC circuit, or any other circuit that enables primary subsystem 202 to function as described herein. Primary subsystem 202 outputs the DC voltage to secondary subsystem 204. Secondary subsystem 204 steps down the DC voltage to a DC voltage demanded by load 110 (shown in FIG. 1). Secondary subsystem 204 may be a buck circuit, a buck-boost circuit, an LLC converter, a DC-DC converter, or any other circuit that enables secondary subsystem 204 to function as described herein.

Figure 3:
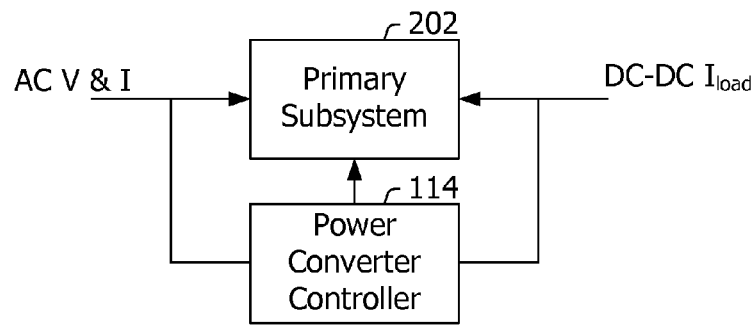
FIG. 3 is a block diagram of an exemplary embodiment of the primary subsystem shown in FIG. 2.

FIG. 3 is a block diagram of an exemplary embodiment of primary subsystem 202 (shown in FIG. 2). Power converter controller 114 receives the load current demand from system controller (not shown in FIG. 3) and communicates a desired output voltage and load current to primary subsystem 202. Accordingly, primary subsystem 202 knows how much load current it should be carrying at that point of time as well as the output voltage required by secondary subsystem 204. A single point failure within primary subsystem 202 may result in a similar failure mode to the embodiment of FIG. 1, where under near normal conditions the output load current meets the threshold, but as load 110 increases, primary subsystem 202 will not be able to keep up with the load current or the output voltage. In this case, power converter 106 declares a fault and shuts itself down. When system controller 112 performs the status check on each power converter 106 at predetermined time intervals, the failed power converter 106 communicates that it has shut down. System controller 112 then decommissions that power converter 106 out of the load share so that it is not depending on that power converter 106 to provide a portion of the load current. System controller 112 then recalculates the load current instruction among the remaining operational power converters 106. A failure in primary subsystem 202 may result in peak charging and potentially blow a fuse, and system controller 112 is provided to prevent such an occurrence.

Figure 4:
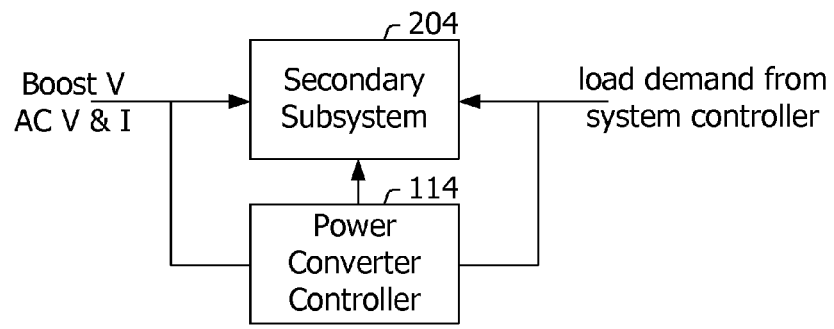
FIG. 4 is a block diagram of an exemplary embodiment of the secondary subsystem shown in FIG. 2.

FIG. 4 is a block diagram of an exemplary embodiment of secondary subsystem 204 (shown in FIG. 2). As described above, power converter controller 114 receives the load current demand from system controller 112 and communicates the desired output voltage and load current to secondary subsystem 204. Accordingly, secondary subsystem 204 knows how much load current it should be carrying at that point of time as well as the output voltage required by load 110.

If power converter controller 114 recognizes that secondary subsystem 204 is not outputting the required load current or is not meeting a threshold associated with the required load current, and secondary subsystem 204 has not realized a fault or failure, power converter controller 114 monitors the output current for a predetermined period of time. If secondary subsystem 204 does not meet the required load current for the predetermined period of time, power converter controller 114 shuts down two-stage power converter 200.

At predetermined time intervals, system controller 112 performs a status check on each power converter 106. When failed power converter 106 communicates that it has shut down, system controller 112 decommissions that power converter 106 out of the load share so that it is not depending on that power converter 106 to provide a portion of the load current. System controller 112 then recalculates the load current instruction among the remaining operational power converters 106.

Additionally or alternatively, secondary subsystem 204 may act as a controller for primary subsystem 202. In such an embodiment, power converter controller 114 monitors a status of primary subsystem 202 based on a monitored input voltage and output demand on secondary subsystem 204. For example, power converter controller 114 knows the demanded output current on secondary subsystem 204 and has an expected output voltage to be received from primary subsystem 202 based on the demanded output current. When the expected input voltage is not received from primary subsystem 202 for a predetermined time duration, power converter controller 114 determines that primary subsystem 202 has a fault or failure and shuts down power converter 106.

When failed power converter 106 communicates that it has shut down, system controller 112 decommissions that power converter 106 out of the load share so that it is not depending on that power converter 106 to provide a portion of the load current. System controller 112 then recalculates the load current instruction among the remaining operational power converters 106.

An exemplary technical effect of the methods and systems described herein includes at least one of: (a) comparing, by a power converter controller for a corresponding power converter, an output current of the corresponding power converter to a predetermined output current threshold; (b) monitoring the output current for a predetermined time duration when the output current is below the predetermined output current threshold; (c) and shutting down the corresponding power converter when the output current is below the predetermined output current threshold for the predetermined time duration.

Exemplary embodiments of systems and methods of monitoring a power system power converter are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system comprising:
a plurality of parallel-coupled power converters comprising a power converter input and a power converter output, the power converter output configured to be coupled to a load, each power converter of the plurality of parallel-coupled power converters comprising a power converter controller configured to:
compare an output current of a corresponding power converter to a predetermined output current threshold;
monitor the output current for a predetermined time duration when the output current is below the predetermined output current threshold;
shut down the corresponding power converter when the output current is below the predetermined output current threshold for the predetermined time duration; and
a system controller communicatively coupled to each power converter controller, said system controller configured to:
monitor a load current demand of the load;
determine an amount of load current to be supported by each power converter of said plurality of parallel-coupled power converters such that the load current is equally distributed among said each power converter; and
transmit a load current instruction to each power converter controller, the load current instruction representing the amount of load current for said each power converter to support.

2. The system of claim 1, wherein each power converter controller is further configured to:
receive the load current instruction from said system controller; and
operate the corresponding power converter to output the amount of load current based on the load current instruction.

3. The system of claim 1, wherein said system controller is further configured to communicate with said each power converter controller at predetermined time intervals to perform a status check on said plurality of parallel-coupled power converters.

4. The system of claim 3, wherein said power converter controller is configured to transmit a failed power converter signal to said system controller in response to the status check when said power converter controller has shut down the corresponding power converter, the failure signal indicating that the corresponding power converter cannot support the amount of load current requested by said system controller.

5. The system of claim 4, wherein said system controller is further configured to:
decommission the failed corresponding power converter from said plurality of parallel-coupled power converters; and
recalculate the amount of load current to be supported by each remaining power converter of said plurality of parallel-coupled power converters such that the load current is equally distributed among said each remaining power converter.

6. The system of claim 1, wherein each power converter of said plurality of parallel-coupled power converters comprises:
a primary subsystem configured to convert an alternating current (AC) input voltage to a direct current (DC) voltage; and
a secondary subsystem coupled to an output of said primary subsystem, said secondary subsystem configured to convert the DC voltage received from said primary subsystem to a DC voltage demanded by the load.

7. The system of claim 6, wherein said power converter controller is further configured to communicate a desired DC output voltage and load current for said primary subsystem to generate based on the load current instruction received from said system controller.

8. The system of claim 7, wherein said power converter controller is further configured to:
monitor the DC output voltage and load current generated by said primary subsystem;
shut down the power converter when one of the DC output voltage and the load current generated by said primary subsystem is below a primary subsystem output threshold for a predetermined time period;
communicate a failed power converter signal to said system controller in response to a status check performed at predetermined time intervals when said power converter controller has shut down the power converter.

9. The system of claim 8, wherein the failed power converter signal includes an indication that the failure occurred in said primary subsystem.

10. The system of claim 6, wherein said power converter controller is further configured to communicate a desired DC output voltage and load current for said secondary subsystem to generate based on the load current instruction received from said system controller.

11. The system of claim 10, wherein said power converter controller is further configured to:
monitor the DC output voltage and load current generated by said secondary subsystem;
shut down the power converter when one of the DC output voltage and the load current generated by said secondary subsystem is below a secondary subsystem output threshold for a predetermined time period;
communicate a failed power converter signal to said system controller in response to a status check performed at predetermined time intervals when said power converter controller has shut down the power converter.

12. The system of claim 6, wherein said power converter controller is further configured to:
determine an expected DC output voltage of said primary subsystem based on the load current instruction received from said system controller;
monitor the DC output voltage of said primary subsystem received at said secondary subsystem; and shut down the power converter when the monitored DC output voltage of said primary subsystem is below the expected DC output voltage for a predetermined time duration.

13. A method of monitoring a power system, the power system including a plurality of parallel-coupled power converters having a power converter input and a power converter output, the power converter output configured to be coupled to a load, each power converter of the plurality of parallel-coupled power converters including a power converter controller, said method comprising:

comparing, by the power converter controller of a corresponding power converter, an output current of the corresponding power converter to a predetermined output current threshold;

monitoring, by the power converter controller, the output current for a predetermined time duration when the output current is below the predetermined output current threshold;

shutting down, by the power converter controller, the corresponding power converter when the output current is below the predetermined output current threshold for the predetermined time duration; and wherein the power system further includes a system controller communicatively coupled to each power converter controller, said method further comprising:

monitoring, by the system controller, a load current demand of the load;

determining, by the system controller, an amount of load current to be supported by each power converter such that the load current is equally distributed among each power converter; and transmitting, by the system controller, a load current instruction to each power converter controller, the load current instruction representing the amount of load current for said each power converter to support.

14. The method of claim 13, further comprising:

operating, by the system controller, the corresponding power converter to output the amount of load current based on the load current instruction;

communicating, by the system controller, with each power converter controller at predetermined time intervals to perform a status check on the plurality of parallel-coupled power converters; and transmitting, by the power converter controller, a failed power converter signal to the system controller in response to the status check when the power converter controller has shut down the corresponding power converter, the failure signal indicating that the corresponding power converter cannot support the amount of load current requested by the system controller.

15. The method of claim 14, further comprising:

decommissioning, by the system controller, the failed corresponding power converter from the plurality of parallel-coupled power converters; and recalculating the amount of load current to be supported by each remaining power converter of the plurality of parallel-coupled power converters such that the load current is equally distributed among each remaining power converter.

16. The method of claim 13, wherein each corresponding power converter includes a primary subsystem configured to convert an alternating current (AC) input voltage to a direct current (DC) voltage and a secondary subsystem coupled to an output of the primary subsystem, the secondary subsystem configured to convert the DC voltage received from the primary subsystem to a DC voltage demanded by the load, said method further comprising:

communicating, by the power converter controller, a desired DC output voltage and load current for the primary subsystem to generate based on the load current instruction received from the system controller;

monitoring the DC output voltage and load current generated by the primary subsystem;

shutting down the power converter when one of the DC output voltage and the load current generated by the primary subsystem is below a primary subsystem output threshold for a predetermined time period; and communicating a failed power converter signal to the system controller in response to a status check performed at predetermined time intervals when the corresponding power converter controller has shut down the power converter.

17. The method of claim 13, wherein each corresponding power converter includes a primary subsystem configured to convert an alternating current (AC) input voltage to a direct current (DC) voltage and a secondary subsystem coupled to an output of the primary subsystem, the secondary subsystem configured to convert the DC voltage received from the primary subsystem to a DC voltage demanded by the load, said method further comprising:

communicating, by the power converter controller, a desired DC output voltage and load current for the secondary subsystem to generate based on the load current instruction received from the system controller;

monitoring the DC output voltage and load current generated by the secondary subsystem;

shutting down the power converter when one of the DC output voltage and the load current generated by the secondary subsystem is below a primary subsystem output threshold for a predetermined time period; and communicating a failed power converter signal to the system controller in response to a status check performed at predetermined time intervals when the corresponding power converter controller has shut down the power converter.

18. The method of claim 13, wherein each corresponding power converter includes a primary subsystem configured to convert an alternating current (AC) input voltage to a direct current (DC) voltage and a secondary subsystem coupled to an output of the primary subsystem, the secondary subsystem configured to convert the DC voltage received from the primary subsystem to a DC voltage demanded by the load, said method further comprising:

determining, by the power converter controller, an expected DC output voltage of the primary subsystem based on the load current instruction received from the system controller;

monitoring the DC output voltage of the primary subsystem received at the secondary subsystem; and shutting down the power converter when the monitored DC output voltage of the primary subsystem is below the expected DC output voltage for a predetermined time duration.

* * * * *